(12) United States Patent
Yu (10) Patent No.: US 7,626,470 B2
(45) Date of Patent: Dec. 1, 2009

(54) VOLTAGE-CONTROLLED OSCILLATOR FOR MULTI-BAND AND RF COMMUNICATION APPARATUS HAVING THE SAME

(75) Inventor: Jin-Hyuck Yu, Hwaseong-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 85 days.

(21) Appl. No.: 11/736,732

(22) Filed: Apr. 18, 2007

(65) Prior Publication Data

US 2008/0036550 A1   Feb. 14, 2008

(30) Foreign Application Priority Data

Apr. 18, 2006   (KR) .................. 10-2006-0035030

(51) Int. Cl.
*H03K 3/282* (2006.01)
(52) U.S. Cl. ............................. 331/117 R
(58) Field of Classification Search ........... 331/115, 331/117 R, 1 R
See application file for complete search history.

(56) References Cited

U.S. PATENT DOCUMENTS 6,621,365 B1   9/2003   Hallivuori et al.
7,209,017 B2*  4/2007   Sze et al. ................ 331/179
7,323,944 B2*  1/2008   Florescu et al. ............ 331/14

FOREIGN PATENT DOCUMENTS

| JP | 2004-048589 | 2/2004 |
| JP | 2004-120215 | 4/2004 |
| KR | 1020030053791 A | 7/2003 |

* cited by examiner

*Primary Examiner*—Rexford N Barnie
*Assistant Examiner*—Thienvu V Tran
(74) *Attorney, Agent, or Firm*—F. Chau & Assoc., LLC (57) ABSTRACT

A voltage-controlled oscillator (VCO) for a multi-band receiver, and a radio-frequency (RF) communication apparatus having the same. The VCO includes at least two fine tune branches, that is, a main fine tune branch and an auxiliary fine tune branch. The main fine tune branch includes at least one variable capacitor whose capacitance varies according to a tuning voltage. The auxiliary fine tune branch includes at least one varactor that operates either as a variable capacitor whose capacitance varies according to the tuning voltage or a fixed capacitor regardless of the tuning voltage, based on an operating frequency band. Accordingly, it is possible to prevent phase noise from increasing by varying the gain of the VCO according to the frequency band of an oscillation signal from the VCO.

9 Claims, 6 Drawing Sheets

VOLTAGE-CONTROLLED OSCILLATOR FOR MULTI-BAND AND RF COMMUNICATION APPARATUS HAVING THE SAME

CROSS-REFERENCE TO RELATED PATENT APPLICATION

This application claims the priority of Korean Patent Application No. 10-2006-0035030, filed on Apr. 18, 2006, in the Korean Intellectual Property Office, the disclosure of which is incorporated herein in its entirety by reference.

BACKGROUND OF THE INVENTION

1. Technical Field

The present disclosure relates to a radio-frequency (RF) communication apparatus and more, particularly, to a multi-band voltage-controlled oscillator (VCO) whose gain can be controlled depending upon a frequency band of interest, and an RF communication apparatus having the same.

2. Discussion of the Related Art

A local oscillator is included in a radio-frequency (RF) communication apparatus for conversion of signal frequency. A representative example of the local oscillator is a voltage-controlled oscillator (VCO) capable of changing an oscillation frequency according to a control voltage.

A large number of RF communication apparatuses operate in a broadband or a multi-band scenario. For example, a dual-band mobile telecommunication terminal has recently been introduced to support different frequency bands, such as a cellular band (around 800 Mhz band) and a PCS band (around 1800 MHz to 2 GHz). Thus, a VCO built into an RF communication apparatus that operates in a broadband or a multi-band, must also have a commensurate broadband operating frequency.

The VCO having a multi-band operating frequency generally includes a varactor whose capacitance varies according to the voltage applied thereto, in order to change the oscillation frequency of the oscillator. More specifically, the varactor is a device whose capacitance varies according to a bias voltage applied to a PN junction in the reverse direction. The range of tuning is very limited when using only the varactor, however, since the range of controlling the varactor is limited and active devices in the VCO have parasitic components. Accordingly, a VCO may be embodied to have a wide tuning range by including capacitors connected to switches and inductors connected to switches in the VCO. The inductors occupy a larger chip area than the capacitors, however, and continuous frequency tuning is difficult when the inductors are used.

Accordingly, a capacitance varying method is preferred to an inductance varying method.

A general VCO includes a coarse tune branch and a fine tune branch. A capacitance component in the coarse tune branch is adjusted by controlling a capacitor connected to a switch. The fine tune branch includes a varactor whose capacitance component varies according to a voltage and, thus, a capacitance component in the fine tune branch is changed according to the voltage. The VCO further includes an inductor in order to obtain a multi-band operating frequency by oscillation of an inductance component in the inductor and the conductance components in the coarse tune branch and the fine tune branch.

As the sizes of RF communication apparatuses have been reduced more and more, however, it is required to control a multi-band frequency signal with only a VCO, thus causing many problems.

In general, since a VCO that uses a fine tune branch has a fixed gain, it is difficult to control the gain of the VCO in a low frequency band and a high frequency band in different respective fashions. For example, when a VCO for a low frequency band generates a high-frequency signal, since the VCO for a low frequency band needs a large gain, the gain of the high-frequency signal is unnecessarily increased, thus increasing phase noise. The phase noise is a decisive factor that determines major performances of an RF circuit, such as selectivity and sensitivity. Accordingly, an increase in the phase noise causes a serious problem.

SUMMARY OF THE INVENTION

Exemplary embodiments of the present invention provide a voltage-controlled oscillator (VCO) for a multi-band receiver, which can operate in a multi-frequency band while preventing phase noise from deteriorating in a high-frequency band, and a radio-frequency (RF) communication apparatus having the VCO.

Exemplary embodiments of the present invention also provide a VCO for a multi-band receiver, a gain of which can be controlled according to a frequency band by adjusting the range of variable capacitance according to the frequency band, and an RF communication apparatus having the VCO.

According to an exemplary embodiment of the present invention, there is provided an RF communication apparatus having a VCO that generates a local oscillation signal and a mixer that mixes an RF signal and the local oscillation signal.

The VCO includes at least two fine tune branches whose capacitance values vary according to a tuning voltage or are fixed regardless of the tuning voltage, based on an operating frequency band.

The VCO may include an inductor, a main line tune branch, and an auxiliary fine tune branch. The main fine tune branch includes at least one capacitor whose capacitance varies according to a tuning voltage, and the auxiliary fine tune branch includes at least one varactor that operates either as a variable capacitor whose capacitance varies according to the tuning voltage or a fixed capacitor having a fixed capacitance regardless of the tuning voltage, based on an operating frequency band.

The VCO may include an inductor connected to a first output terminal and a second output terminal, a first switch based on an operating frequency band, a main line tune branch, and an auxiliary fine tune branch. The main fine tune branch is connected between the first and second output terminals, and has a capacitance that varies according to a tuning voltage. The auxiliary fine tune branch is connected between the first and second output terminals, and has a capacitance that varies according to the tuning voltage when the first switch is turned on, and a capacitance that is fixed when the first switch is turned off.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Hereinafter, exemplary embodiments of the present invention will be described in detail with reference to the accompanying drawings. Like reference numerals denote like elements throughout the drawings.

Figure 1:
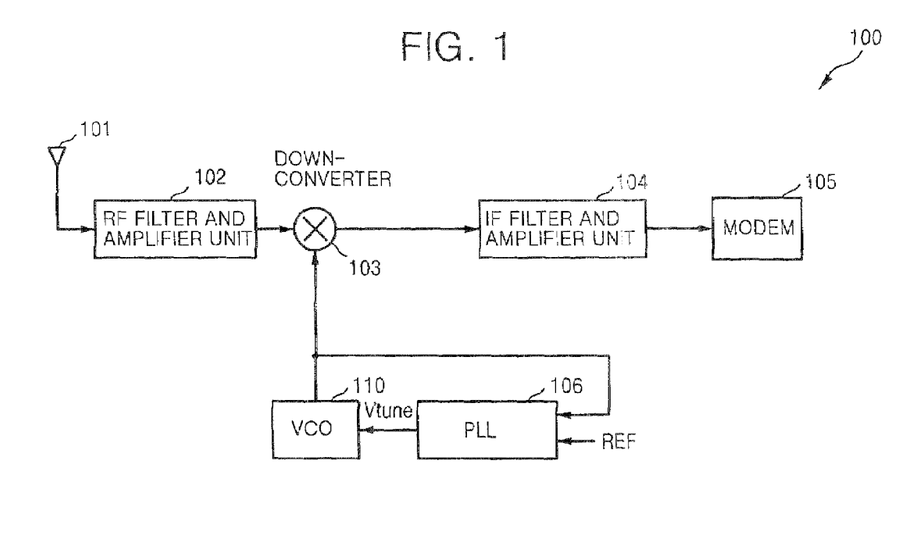
FIG. 1 is a block diagram of a radio frequency (RF) communication apparatus according to an exemplary embodiment of the present invention.

FIG. 1 is a block diagram of a radio-frequency (RF) communication apparatus 100 according to an exemplary embodiment of the present invention. In particular, FIG. 1 is a schematic block diagram of a receiver 100 of an RF communication apparatus, according to an exemplary embodiment of the present invention.

Referring to FIG. 1, the receiver 100 includes an antenna 101, an RF filter and amplifier unit 102, a down-converter 103, an intermediate-frequency (IF) filter and amplifier unit 104, a modem 105, a phase locked loop (PLL) 106, and a voltage-controlled oscillator (VCO) 110.

The RF filter and amplifier 102 receives incoming RF signals via the antenna 101, amplifies only the RF signal having a desired frequency band of the received RF signals, and outputs the amplified RF signal.

The down-converter 103 is a mixer that mixes the amplified RF signal received from the RF filter and amplifier 102 and a local oscillation signal produced by the VCO 110 in order to convert the amplified RF signal into an IF-band signal. Although the RF signal may be converted directly into a base-band signal by the down-converter 103, it is assumed that the RF signal is first converted into an IF-band signal (intermediate frequency) by the down-converter 103.

The IF filter and amplifier unit 104 amplifies only a desired channel signal of the IF-band signal from the down-converter 103, and outputs the amplified desired signal.

The modem 105 is a device that processes the amplified signal received from the IF filter and amplifier unit 104 in order to restore the original data. The modem 105 may perform various signal processings, such as audio-to-digital (A/D) conversion, decrypting, de-interleaving, and decoding.

The VCO 110 outputs a local oscillation signal led to the down-converter 103 based on a tuning voltage Vtune.

The PLL 106 compares a reference oscillation signal REF with a feedback signal of the local oscillation signal received from the VCO 110, and controls the VCO 110 to synchronize the phase and frequency of the feedback signal with those of the reference oscillation signal REF, so that the frequency of the local oscillation signal can be tuned and locked to a predetermined frequency.

Figure 2:
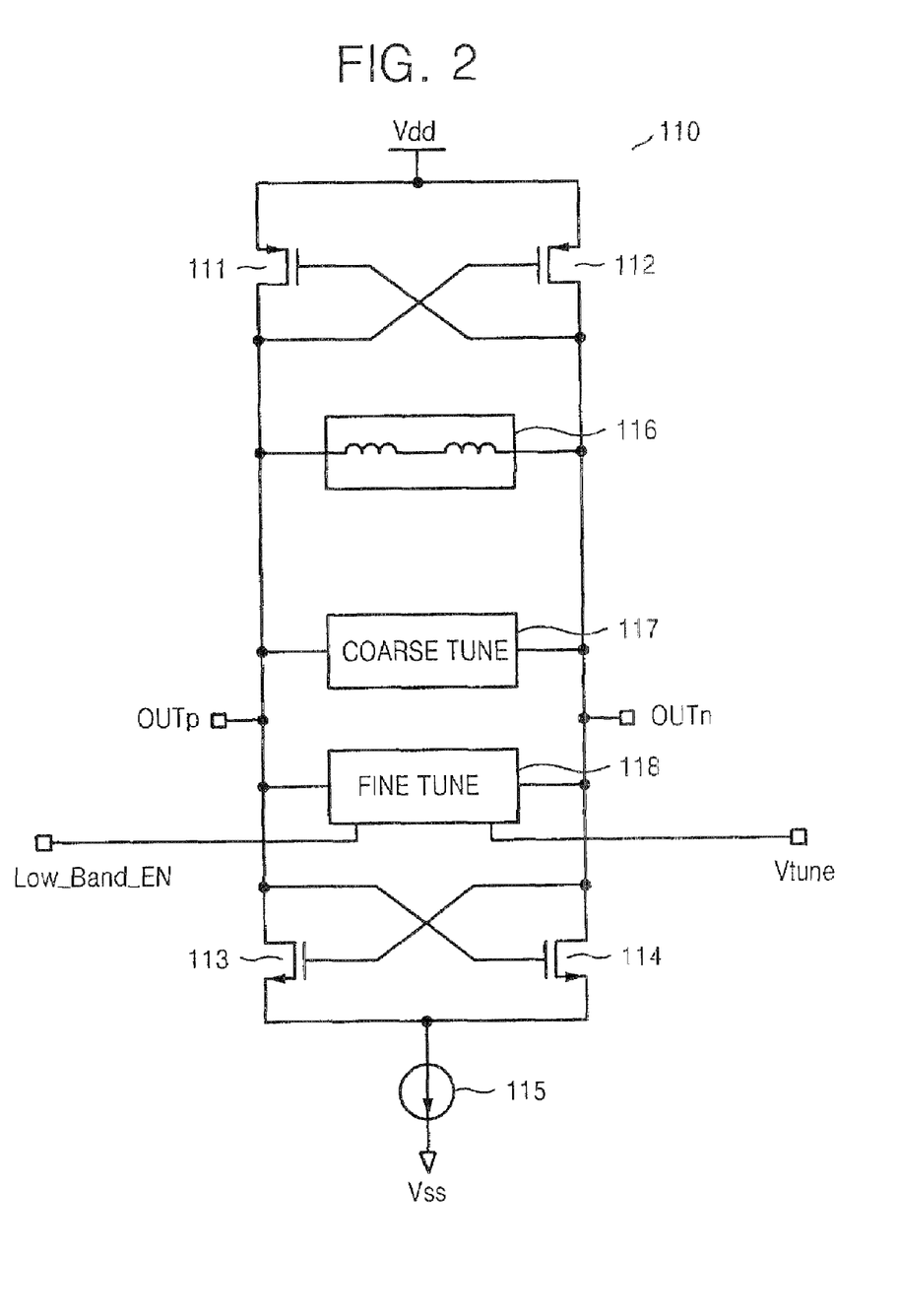
FIG. 2 is a circuit diagram of a voltage-controlled oscillator (VCO) according to an exemplary embodiment of the present invention.

FIG. 2 is a circuit diagram of the voltage-controlled oscillator (VCO) 110 of FIG. 1, according to an exemplary embodiment of the present invention. Referring to FIGS. 1 and 2, the VCO 110 includes a first P-channel transistor 111, a second P-channel transistor 112, a first N-channel transistor 113, a second N-channel transistor 114, a current source 115, an inductance branch 116, a coarse tuning unit 117, and a fine tuning unit 118.

The first P-channel transistor 111 has a source connected to a supply voltage terminal Vdd, a drain connected to a positive output terminal OUTp, and a gate connected to a negative output terminal OUTn.

The second P-channel transistor 112 has a source connected to the supply voltage terminal Vdd, a gate connected to the positive output terminal OUTp, and a drain connected to the negative output terminal OUTn.

The first N-channel transistor 113 has a drain connected to the positive output terminal OUTp, a gate connected to the negative output terminal OUTn, and a source connected to a ground voltage terminal Vss through the current source 115.

The second N-channel transistor 114 has a gate connected to the positive output terminal OUTp, a drain connected to the negative output terminal OUTn, and a source connected to the ground voltage terminal Vss through the current source 115.

The first P-channel transistor 111, the second P-channel transistor 112, the first N-channel transistor 113, and the second N-channel transistor 114 operate as negative resistance to supply power to the VCO 110.

The inductance branch 116, the coarse tuning unit 117, and the fine tuning unit 118 are connected in parallel between the positive output terminal OUTp and the negative output terminal OUTn.

Local oscillation signals having the opposite phases but the same frequency are respectively output from the positive output terminal OUTp and the negative output terminal OUTn.

The inductance branch 116 is an inductance component for oscillation, and the coarse tuning unit 117 and the fine tuning unit 118 are capacitance components for oscillation.

The VCO 110 generates a local oscillation frequency through oscillation of the inductance component and the capacitance components. Although not illustrated in FIG. 2, the coarse tuning unit 117 may be embodied as a plurality of capacitors connected via a switch. The capacitance of the coarse tuning unit 117 is determined by connecting the capacitors to, or disconnecting the capacitors from, the switch and controlling the switch by using a predetermined digital signal. A coarse operating frequency band of the VCO 110 for generating the local oscillation frequency is determined by the determined capacitance.

The capacitance of the fine tuning unit 118 is changed based on a low-band enable signal Low_Band_EN and a tuning voltage Vtune. The tuning voltage Vtune is output from the PLL 106.

The low-band enable signal Low_Band_EN may be output from the modem 108 of the RF communication apparatus 100 that includes the VCO 110, but is not limited thereto.

Figure 3:
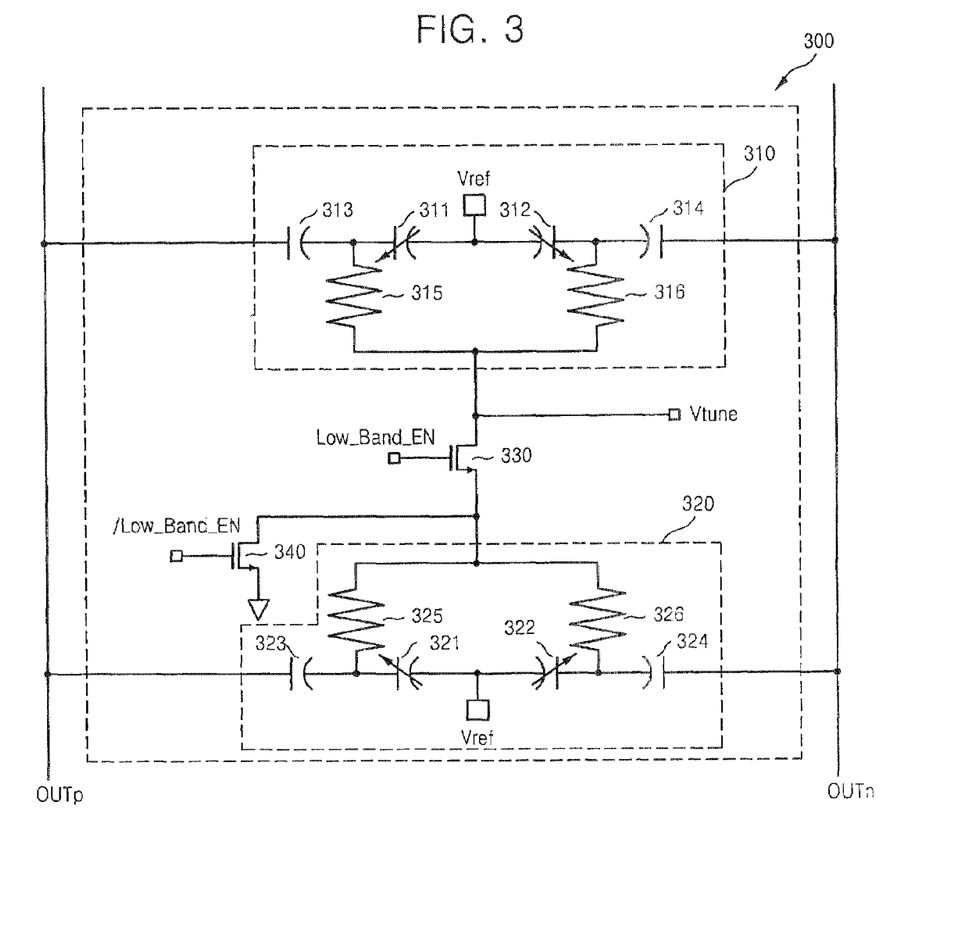
FIG. 3 is a circuit diagram of a fine tuning unit according to an exemplary embodiment of the present invention.

FIG. 3 is a circuit diagram of a fine tuning unit 300 according to an exemplary embodiment of the present invention. Referring to FIGS. 1 and 3, the fine tuning unit 300 includes a main fine tune branch 310, an auxiliary fine tune branch 320, a first switch 330, and a second switch 340.

The first and second switches 330 and 340 may be NMOS transistors but are not limited thereto.

The main fine tune branch 310 includes a first varactor 311, a second varactor 312, a first capacitor 313, a second capacitor 314, a first resistor 315, and a second resistor 316.

The auxiliary fine tune branch 320 includes a third varactor 321, a fourth varactor 322, a third capacitor 323, a fourth capacitor 324, a third resistor 325, and a fourth resistor 326.

Each of the first varactor 311, the second varactor 312, the third varactor 321 and fourth varactor 322 may be an accumulation mode Metal Oxide Semiconductor Field Effect Transistor (MOSFET) varactor (AMOS) that is embodied as a MOS transistor whose source and drain are connected, but it is not limited thereto.

The first varactor 311 has a cathode connected to a tuning voltage terminal Vtune via the first resistor 315, and an anode connected to a reference voltage terminal Vref.

The second varactor 312 has a cathode connected to the tuning voltage terminal Vtune via the second resistor 316, and an anode connected to the reference voltage terminal Vref.

A reference voltage applied to the reference voltage terminal Vref may be half a supply voltage applied to a supply voltage terminal Vdd, that is, Vdd/2, but is not limited thereto. The reference voltage applied to the reference voltage terminal Vref may be properly set through a predetermined simulation or a test.

The cathode of the first varactor 311 is connected to a positive output terminal OUTp via the first capacitor 313.

The cathode of the second varactor 312 is connected to a negative output terminal OUTn via the second capacitor 314.

Thus, the first and second varactors 311 and 312 of the main fine tune branch 310 are always controlled by the tuning voltage Vtune applied in the reverse direction.

The third varactor 321 has a cathode connected to the tuning voltage terminal Vtune via the third resistor 325 and the first switch 330, and an anode connected to the reference voltage terminal Vref.

The fourth varactor 322 has a cathode connected to the tuning voltage terminal Vtune via the fourth resistor 326 and the second switch 340, and an anode connected to the reference voltage terminal Vref.

The cathode of the third varactor 321 is connected to the positive output terminal OUTp via the third capacitor 323.

The cathode of the fourth varactor 322 is connected to the negative output terminal OUTn via the fourth capacitor 324.

Therefore, since the third and fourth varactors 321 and 322 of the auxiliary fine tune branch 320 receive the tuning voltage Vtune via the first switch 330, the capacitance in the auxiliary fine tune branch 320 is changed by the tuning voltage Vtune only when the first switch 330 is turned on.

The second switch 340 has a drain connected to the tuning voltage terminal Vtune via the first switch 330, and a source connected to a ground voltage terminal Vss, see FIG. 2.

The first switch 330 is controlled based on a low-band enable signal Low_Band_EN, and the second switch 340 is controlled based on an inversion signal of the low-band enable signal Low_Band_EN. Thus, the second switch 340 operates complimentarily with the first switch 330.

The low-band enable signal Low_Band_EN is used to control the gain of the VCO 110 according to a frequency band.

The low-band enable signal Low_Band_EN may be generated by and output from the modem 105 of the RF communication apparatus 100, but is not limited thereto.

Figure 4:
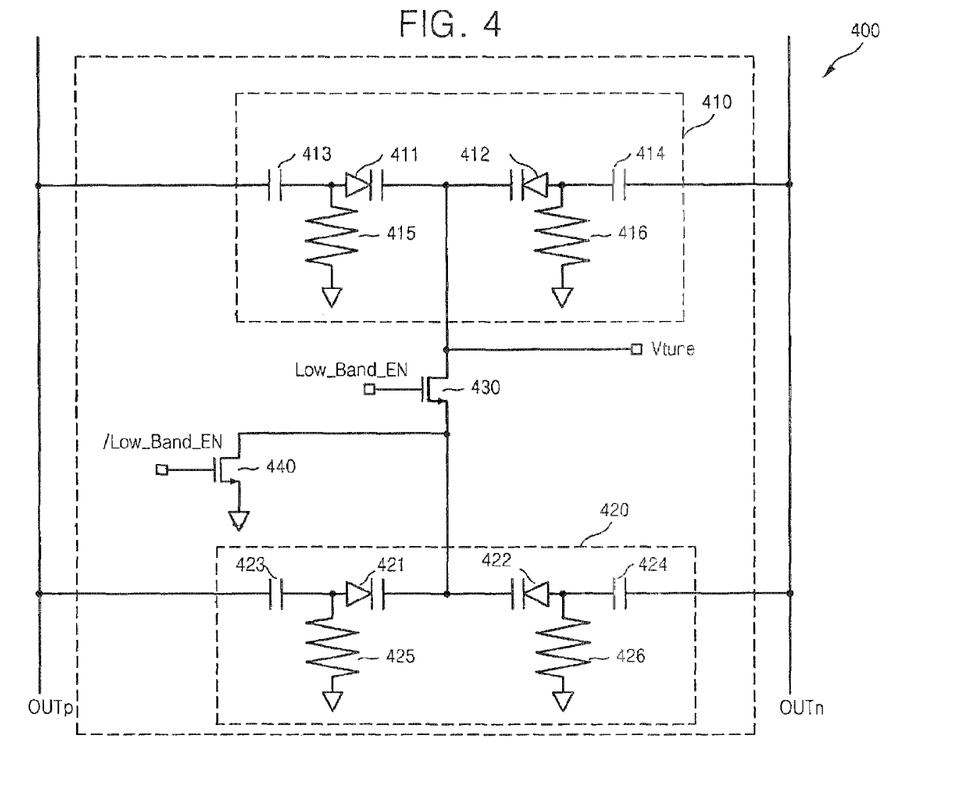
FIG. 4 is a circuit diagram of a fine tuning unit according to an exemplary embodiment of the present invention.

FIG. 4 is a circuit diagram of a fine tuning unit 400 according to an exemplary embodiment of the present invention. Referring to FIGS. 1 and 4, the fine tuning unit 400 includes a main fine tune branch 410, an auxiliary fine tune branch 420, a first switch 430, and a second switch 440.

The first and second switches 430 and 440 may be embodied as NMOS transistors but are not limited thereto.

The main fine tune branch 410 includes a first varactor 411, a second varactor 412, a first capacitor 413, a second capacitor 414, a first resistor 415, and a second resistor 416.

The auxiliary fine tune branch 420 includes a third varactor 421, a fourth varactor 422, a third capacitor 423, a fourth capacitor 424, a third resistor 425, and a fourth resistor 426.

The first varactor 411, the second varactor 412, the third varactor 421 and the fourth varactor 422 may be diode varactors as shown, but they are not limited thereto.

The first varactor 411 has an anode connected to a ground voltage terminal Vss via the first resistor 415, and a cathode connected to a tuning voltage terminal Vtune.

The second varactor 412 has an anode connected to the ground voltage terminal Vss via the second resistor 416, and a cathode connected to the tuning voltage terminal Vtune.

The anode of the first varactor 411 is connected to a positive output terminal OUTp via the first capacitor 413.

The anode of the second varactor 412 is connected to a negative output terminal OUTn via the second capacitor 414.

Thus, the first and second varactors 411 and 412 of the main fine tune branch 410 are always controlled by the tuning voltage Vtune applied in the reverse direction.

The third varactor 421 has an anode connected to the ground voltage terminal Vss via the third resistor 425, and a cathode connected to the tuning voltage terminal Vtune via the first switch 430.

The fourth varactor 422 has an anode connected to the ground voltage terminal Vss via the fourth resistor 426, and a cathode connected to the tuning voltage terminal Vtune via the first switch 430.

The anode of the third varactor 421 is connected to the output terminal OUTp via the third capacitor 423.

The anode of the fourth varactor 422 is connected to the negative output terminal OUTn via the fourth capacitor 424.

Thus, since the third and fourth varactors 421 and 422 of the auxiliary fine tune branch 420 receive the tuning voltage Vtune via the first switch 430, the capacitance in the auxiliary fine tune branch 420 is changed by the tuning voltage Vtune only when the first switch 430 is turned on.

The second switch 440 has a drain connected to the tuning voltage terminal Vtune via the first switch 430, and a source connected to the ground voltage terminal Vss.

The first switch 430 is controlled based on a low-band enable signal Low_Band_EN, and the second switch 440 is controlled based on an inversion signal of the low-band enable signal Low_Band_EN. Thus, the second switch 440 operates complimentarily with the first switch 430.

Figure 5:
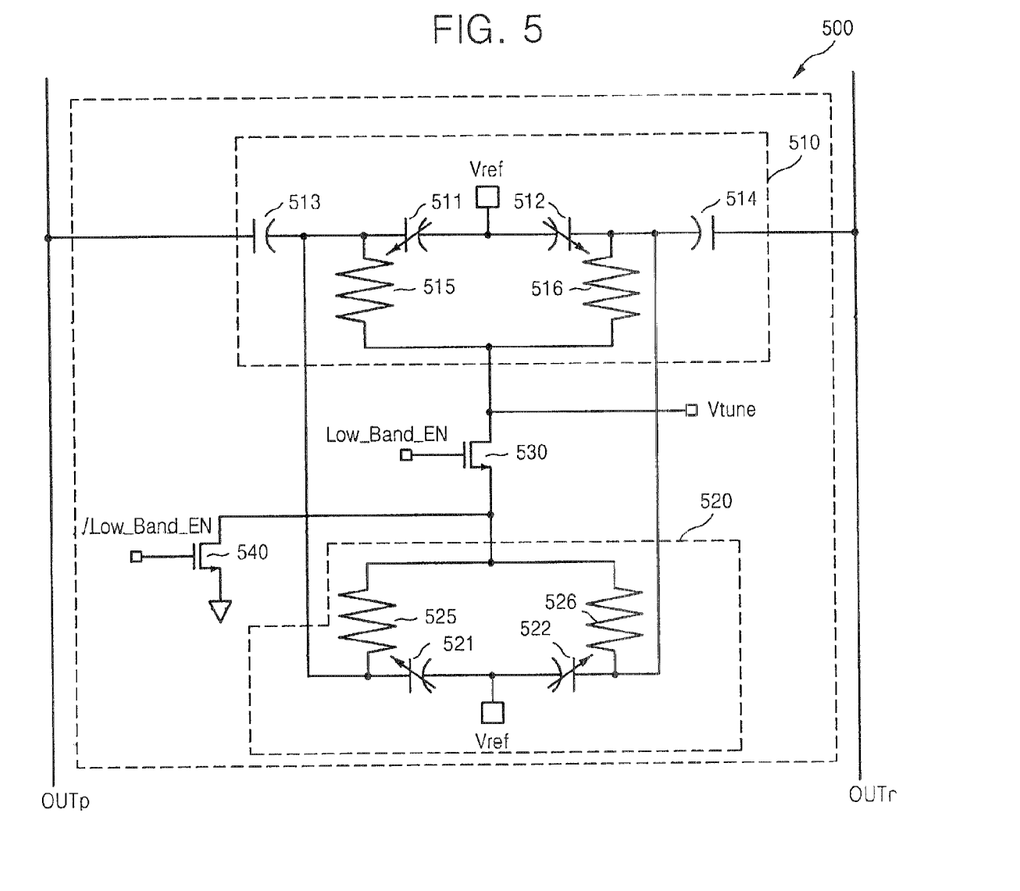
FIG. 5 is a circuit diagram of a fine tuning unit according to an exemplary embodiment of the present invention.

FIG. 5 is a circuit diagram of a fine tuning unit 500 according to an exemplary embodiment of the present invention. Referring to FIG. 5, the fine tuning unit 500 includes a main fine tune branch 510, an auxiliary fine tune branch 520, and first and second switches 530 and 540.

The first and second switches 530 and 540 may be NMOS transistors but are not limited thereto.

Referring to FIGS. 3 and 5, the main fine tune branch 510 includes a first varactor 511, a second varactor 512, a first capacitor 513, a second capacitor 514, a first resistor 515, and a second resistor 516. The main fine tune branch 510 has the same construction as the main fine tune branch 310 of the fine tuning unit 300 illustrated in FIG. 3. Accordingly, since the operation of the main fine tune branch 510 is the same as that of the main fine tune branch 310, a detailed description of the main fine tune branch 510 will be omitted here.

The construction of the auxiliary fine tune branch 520 is fairly similar to that of the auxiliary fine tune branch 320 of the fine tuning unit 300 illustrated in FIG. 3. Similarly to the auxiliary fine tune branch 320, the auxiliary fine tune branch 520 includes a first varactor 521, a second varactor 522, a first resistor 525, and a second resistor 526. Unlike the auxiliary fine tune branch 320, however, the auxiliary fine tune branch 520 does not include additional capacitors but shares the first and second capacitors 513 and 514 with the main fine tune branch 510. Thus, the cathode of the third varactor 521 is connected to a positive output terminal OUTp via the first capacitor 513. The cathode of the fourth varactor 522 is connected to a negative output terminal OUTn via the second capacitor 514. The operation of the auxiliary fine tune branch 520 is almost the same as that of the auxiliary fine tune branch 320, and a detailed description thereof will be omitted here. A low-band enable signal Low_Band_EN is used to control the gain of the VCO 110 according to a desired frequency band. The gain of the VCO 110 indicates a variation in an oscillation frequency versus a variation in the tuning voltage Vtune.

The low-band enable signal Low_Band_EN may be generated by and output from the modem 108 of the RF communication apparatus 100 but is not limited thereto.

When the operating frequency band of the VCO 110 that includes the fine tuning unit 300, 400, or 500 is high, the first switch 330, 430, or 530 is turned off in response to the low-band enable signal Low_Band_EN at a logic low level, thereby disconnecting the auxiliary fine tune branch 320, 420, or 520 from the tuning voltage terminal Vtune. In this case, the second switch 340, 440, or 540 operating complimentarily with the first switch 330, 430 or 530 is turned on to apply a bias voltage to the third varactor 321, 421, or 521 and the fourth varactor 322, 422, or 522 in a forward direction. Therefore, the third varactor 321, 421 or 521 and the fourth varactor 322, 422, or 522 operate as fixed capacitors having a fixed capacitance.

When the operating frequency band of the VCO 110 that includes the fine tuning unit 300, 400, or 500 is low, the first switch 330, 430, or 530 is turned on in response to the low-band enable signal Low_Band_EN at a logic high level, thereby connecting the auxiliary fine tune branch 320, 420, or 520 to the tuning voltage terminal Vtune. Accordingly, the capacitance value of the VCO 110 is changed by the tuning voltage Vtune that is a bias voltage applied to the third varactor 321, 421, or 521 and the fourth varactor 322, 422, or 522 in the reverse direction.

Thus, when an operating frequency signal from the VCO 110 has a low frequency, the gain of the VCO 110 is increased by increasing the capacitance value of the VCO 110 controlled by the tuning voltage Vtune. In contrast, when the operating frequency signal has a high frequency, the auxiliary fine tune branch 320, 420 or 520 of the fine tuning unit 300, 400 or 500 operates as a fixed capacitor having a fixed capacitance value regardless of the tuning voltage Vtune, thereby reducing the gain of the VCO 110.

Figure 6:
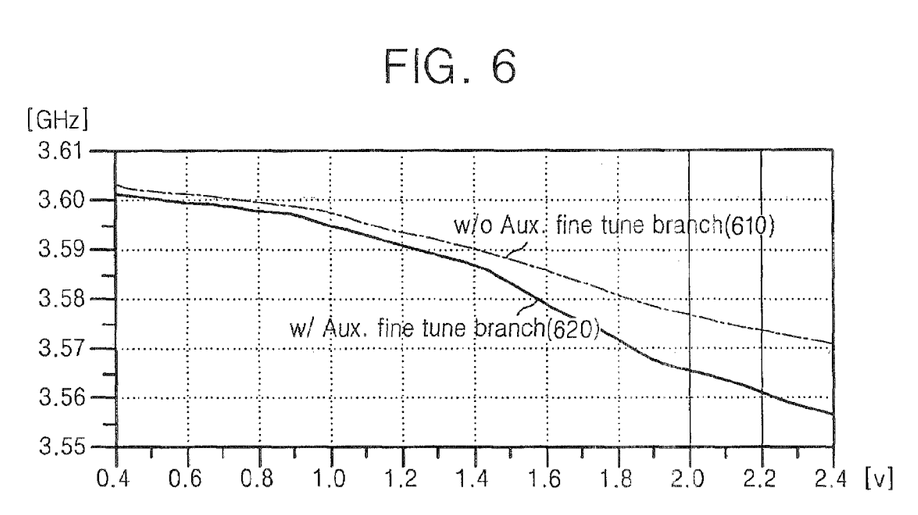
FIG. 6 is a graph illustrating the result of a simulation where outputs of a VCO having the fine tuning unit 500 of FIG. 5 in a low frequency band were measured.

FIG. 6 is a graph illustrating the result of a simulation where outputs of a VCO having the fine tuning unit 500 of FIG. 5 in a low frequency band were measured. Referring to FIG. 6, when a tuning voltage Vtune is in a range of 0.4 to 2.4 V, an output of the VCO, which is indicated with "w/ Aux. fine tune branch 610", that uses the fine tuning unit 300 having the auxiliary fine tune branch 320, and an output of the VCO, which is indicated with "w/o Aux. fine tune branch 620", that uses a fine tuning unit operating only as a main fine branch without an auxiliary fine tune branch were measured in the form of a frequency.

In a low frequency band, the range of a variable frequency versus the tuning voltage Vtune was from approximately 3.570 to 3.604 GHz when the auxiliary fine tune branch 320 of the fine tuning unit 300 acted as a variable capacitor, and was from approximately 3.557 to 3.602 GHz when the fine tuning unit was used without an auxiliary fine tune branch Accordingly, the gain of the VCO can be increased by adding the auxiliary fine tune branch 320 in a low-frequency band.

As described above, according to an exemplary embodiment of the present invention, a fine tune branch acts as either a variable capacitor whose capacitance varies according to a tuning voltage or a fixed capacitor having fixed capacitance regardless of the tuning voltage, based on the frequency band of an oscillation signal. More specifically, the range of variable capacitance is increased in a low frequency band where a comparatively high gain is needed, and reduced in a high frequency band where a comparatively low gain is needed. Accordingly, it is possible to prevent phase noise from increasing in a high frequency band due to an unnecessary increase in a gain, thereby improving the performance of a VCO for a multi-band.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A multi-band voltage-controlled oscillator
   an inductor connected to a first output terminal and a second output terminal;
   a first switch controlled based on an operating frequency band;
   a coarse tuning unit determining a coarse operating frequency band based on a capacitance;
   main fine tune branch connected to the first and second output terminals, and whose capacitance varies according to a tuning voltage; and
   an auxiliary fine tune branch connected to the first and second output terminals, and
   whose capacitance varies according to the tuning voltage when the first switch is turned on and whose capacitance does not vary when the first switch is turned off; and
   a tuning voltage terminal to which the tuning voltage is applied,
   wherein the main fine tune branch comprises:
   a first varactor connected between the tuning voltage terminal via a first resistor, and a first voltage terminal; and
   a second varactor connected between the tuning voltage terminal via a second resistor, and the first voltage terminal, wherein
   the auxiliary fine tune branch comprises:
   a third varactor connected between a first terminal of the first switch via a third resistor, and the first voltage terminal; and
   a fourth varactor connected between the first terminal of the first switch via a fourth resistor, and the first voltage terminal, and
   a second terminal of the first switch is connected to the tuning voltage terminal.

2. The voltage-controlled oscillator of claim 1, wherein the first switch is turned on when the operating frequency band is a first frequency band, and is turned off when the operating frequency band is a second frequency band,
   wherein the first frequency band is lower than the second frequency band.

3. The voltage-controlled oscillator of claim 1, wherein the main fine tune branch further comprises:
   a first capacitor connected between the first voltage terminal via the first varactor, and the first output terminal; and
   a second capacitor connected to the first voltage terminal via the second varactor, and the second output terminal, and wherein
   the auxiliary fine tune branch further comprises:
   a third capacitor connected between the first terminal of the first switch via the third varactor, and the first output terminal; and
   a fourth capacitor connected between the first terminal of the first switch via the fourth varactor, and the second output terminal.

4. The voltage-controlled oscillator of claim 1, wherein one of the main fine tune branch and the auxiliary fine tune branch further comprises:

a first capacitor having a first terminal connected to the first voltage terminal via one of the first varactor and the third varactor, and a second terminal connected to the first output terminal; and a second capacitor having a first terminal connected to the first voltage terminal via one of the second varactor and the fourth varactor, and a second terminal connected to the second output terminal.

5. The voltage-controlled oscillator of claim 1, further comprising a second switch connected between the tuning voltage terminal via the first switch and a second voltage terminal, wherein the second switch operates complementarily with the first switch.

6. A multi-band voltage-controlled oscillator
an inductor connected to a first output terminal and a second output terminal;
a first switch controlled based on an operating frequency band;
a coarse tuning unit determining a coarse operating frequency band based on a capacitance;
a main fine tune branch connected to the first and second output terminals, and whose capacitance varies according to a tuning voltage; and
an auxiliary fine tune branch connected to the first and second output terminals, and
whose capacitance varies according to the tuning voltage when the first switch is turned on and whose capacitance does not vary when the first switch is turned off; and
a tuning voltage terminal to which the tuning voltage is applied,
wherein the main fine tune branch comprises:
a first varactor connected between a first voltage terminal via a first resistor and the tuning voltage terminal; and
a second varactor connected between the first voltage terminal via a second resistor and the tuning voltage terminal, and wherein
the auxiliary fine tune branch comprises:
a third varactor connected between the first voltage terminal via a third resistor and a first terminal of the first switch; and
a fourth varactor connected between the first voltage terminal via a fourth resistor and the first terminal of the first switch, wherein
a second terminal of the first switch is connected to the tuning voltage terminal.

7. The voltage-controlled oscillator of claim 6, wherein the main tine tune branch or the auxiliary fine tune branch comprises:
a first capacitor having a first terminal connected to the first voltage terminal via one of the first resistor and the third resistor, and a second terminal connected to the first output terminal; and
a second capacitor having a first terminal connected to the first voltage terminal via one of the second resistor and the fourth resistor, and a second terminal connected to the second output terminal.

8. The voltage-controlled oscillator of claim 7, wherein the first voltage terminal is a ground voltage terminal.

9. The voltage-controlled oscillator of claim 8, further comprising a second switch connected between the tuning voltage terminal and the ground voltage terminal via the first switch, wherein the second switch operates complementarily with the first switch.

* * * * *